(12) United States Patent
Han et al.

(10) Patent No.: US 10,945,459 B1
(45) Date of Patent: Mar. 16, 2021

(54) PLATED SILICON-BASED ELECTRONIC CIGARETTE ATOMIZING CHIP AND PREPARATION METHOD THEREOF

(71) Applicant: CHINA TOBACCO YUNNAN INDUSTRIAL CO., LTD, Kunming (CN)

(72) Inventors: Yi Han, Kunming (CN); Shoubo Li, Kunming (CN); Li Chen, Kunming (CN); Tinghua Li, Kunming (CN); Yi Xu, Kunming (CN); Donglai Zhu, Kunming (CN); Xiaowei Gong, Kunming (CN); Wei Zhao, Kunming (CN); Xia Zhang, Kunming (CN); Jun Wu, Kunming (CN); Yongkuan Chen, Kunming (CN)

(73) Assignee: CHINA TOBACCO YUNNAN INDUSTRIAL CO., LTD, Kunming (CN)

( * ) Notice: Subject to any disclaimer, the term of this patent is extended or adjusted under 35 U.S.C. 154(b) by 0 days.

(21) Appl. No.: 16/763,560

(22) PCT Filed: Aug. 8, 2019

(86) PCT No.: PCT/CN2019/099830
§ 371 (c)(1),
(2) Date: Sep. 3, 2020

(87) PCT Pub. No.: WO2020/191985
PCT Pub. Date: Oct. 1, 2020

(30) Foreign Application Priority Data

Mar. 25, 2019 (CN) .......................... 201910228763.4

(51) Int. Cl.
*A01M 13/00* (2006.01)
*A24F 40/70* (2020.01)
(Continued)

(52) U.S. Cl.
CPC .............. *A24F 40/70* (2020.01); *A24F 40/10* (2020.01); *A24F 40/46* (2020.01); *A24F 40/48* (2020.01);
(Continued)

(58) Field of Classification Search
CPC .......... A24F 40/10; A24F 40/46; A24F 40/48; A24F 40/70; G03F 7/00; G03F 7/40;
(Continued)

(56) References Cited

U.S. PATENT DOCUMENTS 6,136,212 A * 10/2000 Mastrangelo ........ B01J 19/0093
216/27
6,821,819 B1 * 11/2004 Benavides ............ H01L 23/473
438/122
(Continued)

FOREIGN PATENT DOCUMENTS

CN 104768407 A 7/2015
CN 105394816 A 3/2016
(Continued)

*Primary Examiner* — Hung D Nguyen
(74) *Attorney, Agent, or Firm* — Bayramoglu Law Offices LLC

(57) ABSTRACT

A plated silicon-based electronic cigarette atomizing chip includes the following components: a silicon substrate, wherein the silicon substrate is provided with an array of micro-pillars or an array of micro-holes, an inlet end, and an outlet end, the outer walls of the micro-pillars are plated side walls, the inner walls of the micro-holes are plated inner walls, and the array of micro-pillars defines a plurality of micro-channels or electronic cigarette liquid channels penetrating the micro-holes are provided on the silicon substrate; a glass cover, wherein the air holes passing through the glass cover are provided; and the glass cover is fixedly connected to the silicon substrate by a bonding process.

7 Claims, 6 Drawing Sheets

(51) Int. Cl.
*A24F 40/48* (2020.01)
*A24F 40/10* (2020.01)
*G03F 7/42* (2006.01)
*C03C 15/00* (2006.01)
*A24F 40/46* (2020.01)
*H05B 1/02* (2006.01)
*G03F 7/40* (2006.01)
*C25D 5/54* (2006.01)
*C25D 3/12* (2006.01)

(52) U.S. Cl.
CPC .............. *C03C 15/00* (2013.01); *G03F 7/40* (2013.01); *G03F 7/422* (2013.01); *H05B 1/0297* (2013.01); *C25D 3/12* (2013.01); *C25D 5/54* (2013.01)

(58) Field of Classification Search
CPC ....... G03F 7/422; C03C 15/00; H05B 1/0297; C25D 5/54; C25D 3/12
USPC ....... 392/386, 387, 388, 390, 391, 394, 396, 392/397, 398, 401, 402, 403, 404, 405; 131/328, 329, 330
See application file for complete search history.

(56) References Cited

U.S. PATENT DOCUMENTS

| | | | |
|---|---|---|---|
| 2002/0084510 A1* | 7/2002 | Jun | B81C 1/00119 257/536 |
| 2004/0056016 A1* | 3/2004 | Tian | F27B 17/0025 219/408 |
| 2007/0095507 A1* | 5/2007 | Henderson | F28D 15/043 165/104.26 |
| 2008/0248613 A1* | 10/2008 | Chen | B81B 3/0005 438/115 |
| 2016/0007653 A1 | 1/2016 | Tu | |
| 2019/0246696 A1* | 8/2019 | Schmidt | A61M 11/042 |

FOREIGN PATENT DOCUMENTS

| | | |
|---|---|---|
| CN | 205831080 U | 12/2016 |
| CN | 206603262 U | 11/2017 |
| CN | 108158040 A | 6/2018 |
| CN | 208624642 U | 3/2019 |
| CN | 109770438 A | 5/2019 |

* cited by examiner

PLATED SILICON-BASED ELECTRONIC CIGARETTE ATOMIZING CHIP AND PREPARATION METHOD THEREOF

CROSS REFERENCE TO THE RELATED APPLICATIONS

This application is the national phase entry of International Application No. PCT/CN2019/099830, filed on Aug. 8, 2019, which is based upon and claims priority to Chinese Patent Application No. 201910228763.4, filed on Mar. 25, 2019, the entire contents of which are incorporated herein by reference.

TECHNICAL FIELD

The present invention belongs to the technical field of electronic cigarettes, and more specifically relates to a plated silicon-based electronic cigarette atomizing chip and a preparation method thereof.

BACKGROUND

The heating materials that have been already used in electronic cigarettes or reported in patents mainly include metals, ceramics, polymers, silicon, etc., and the most commonly used heating wires are made of metals. Among them, electronic cigarettes whose temperature cannot be adjusted use nickel-chromium alloy wires or Kanthal heating wires. The Kanthal heating wires are alloys containing nickel, chromium, aluminum, iron, etc. Temperature-controlled electronic cigarettes use pure nickel, pure titanium, or stainless steel as heating wires. The shapes of heating elements include a line shape, a filament shape, a sheet shape, a mesh shape, etc. Electronic cigarette liquid can be heated and atomized by contacting the surfaces or the interiors of the heating elements. For the filament-shaped or line-shaped heating element, there is a problem that the electronic cigarette liquid may be unevenly heated on the surface of the heating element due to the non-planar configuration. For the sheet-shaped heating element, although the heat generated is relatively more uniformly distributed on the surface of the heating element, the element lacks an electronic cigarette liquid dispersing member on the surface and the electronic cigarette liquid is prone to dispersing unevenly, resulting in uneven heating in local areas. For the mesh-shaped heating element, the contact area between the air and the heating element is increased and the electronic cigarette liquid is atomized more sufficiently, however, the heating element also lacks an electronic cigarette liquid dispersing member and there is still a problem of uneven heating due to uneven distribution of the electronic cigarette liquid. Therefore, the above-mentioned surface-contact heating elements commonly require materials such as oil-guiding cotton and the like to assist the dispersion of the electronic cigarette liquid, and these materials may cause new problems of uneven heating due to poor contact with the heating elements.

To improve the above problems and shortcomings, heating channels are made inside silicon materials by micro-machining techniques. The electronic cigarette liquid is heated and atomized inside the silicon materials by the micro-machining properties and the electric heating properties of silicon, which increases heat energy utilization efficiency and does not require the use of additional electronic cigarette liquid dispersing materials. However, as semiconductor materials, silicon and metals have significantly different relationships between resistivity and temperature. In a narrow temperature range with a small maximum value, the resistivity of almost all metals changes linearly with the temperature. For semiconductors, the main factor determining the relationship between resistivity and temperature is the relationships of changes between carrier concentration and mobility with temperature. Specifically, at low temperatures, the carrier concentration increases exponentially, the carrier mobility also increases simultaneously, and the resistivity decreases with increasing temperature. At room temperature, the carrier concentration does not change, the carrier mobility decreases with increasing temperature, and the resistivity increases with increasing temperature. At high temperatures, the carrier concentration increases exponentially and rapidly, although the carrier mobility decreases with increasing temperature, the overall effect is that the resistivity decreases with increasing temperature. Due to the complex relationship between semiconductor resistivity and temperature, when a silicon-based heating material is practically applied to electronic cigarettes, the resistance of the silicon-based heating material fluctuates sharply during the electronic cigarette smoking process and at the high temperature required for atomization of electronic cigarette liquid, causing the instability of the atomization of the electronic cigarette liquid, which directly leads to fluctuations in puff number and sensory quality such as smoke volume.

SUMMARY

The present invention provides a plated silicon-based electronic cigarette atomizing chip and a preparation method thereof, which effectively solves the problems of existing atomizing chips, i.e., uneven heating and large fluctuations in puff number and smoke volume.

The present invention is realized by the following technical solutions.

The first aspect of the present invention relates to a plated silicon-based electronic cigarette atomizing chip, including the following components:

the silicon substrate 1, wherein the silicon substrate 1 is provided with an array of micro-pillars 2 or an array of micro-holes 3, the inlet end 13, and the outlet end 14, the outer walls of the micro-pillars 2 are plated side walls, the inner walls of the micro-holes 3 are plated inner walls, and the array of micro-pillars 2 defines a plurality of micro-channels 12 or electronic cigarette liquid channels 15 penetrating the micro-holes 3 are provided on the silicon substrate 1;

the glass cover 5, wherein the air holes 6 passing through the glass cover 5 are provided; and the glass cover 5 is fixedly connected to the silicon substrate 1 by a bonding process.

In a preferred embodiment of the present invention, the diameter of the micro-pillar (2) or micro-hole (3) ranges from 20 μm to 300 μm.

In a preferred embodiment of the present invention, a plated metal on the plated outer walls of the micro-pillars 2 or the plated inner walls of the micro-holes 3 is a metal or an alloy whose standard electrode potential is more positive than that of $Si/SiO_2$ (e.g., if the standard electrode potential of $SiO_2/Si$ is −0.888 V, and the standard electrode potential of $Ni^{2+}/Ni$ is −0.257 V, then the standard electrode potential of $Ni^{2+}/Ni$ is more positive than that of the $SiO_2/Si$, $Ni^{2+}$ can cause electrons to be generated during silicon oxidation and be reduced to Ni). The electrochemical reaction formula is as follows:

$$Me^{x+} + me^- \rightarrow Me \quad (1)$$

$$Si + 2H_2O \rightarrow SiO_2 + 4H^+ + 4e^- \quad (2)$$

$$SiH_x + 2H_2O \rightarrow SiO_2 + (4+x)H^+ + (4+x)e^- \quad (3)$$

The second aspect of the present invention relates to a method for preparing a plated silicon-based electronic cigarette atomizing chip, including the following steps:

a, etching an array of micro-pillars 2 or an array of micro-holes 3, on the inlet end 13, and the outlet end 14 on the silicon substrate 1;

b, cleaning the silicon substrate 1 after being etched in step a to obtain a clean electroplated surface of the silicon substrate;

c, plating outer walls of the micro-pillars 2 or inner walls of the micro-holes 3 by a plating method to obtain the plated silicon wafer 101;

d, manufacturing an array of air holes 6 passing through the glass cover 5;

e, bonding the plated silicon wafer 101 obtained in step c and the glass cover 5 obtained in step d to obtain the bonded silicon wafer 102 by a bonding process; and f, filling the inlet pipe 9 or a liquid-guiding material at the inlet end 13 of the bonded silicon wafer 102, filling the outlet pipe 10 or the liquid-guiding material at the outlet end 14, then, inserting wires into the bonded silicon wafer 102 to obtain the plated silicon-based atomizing chip 103.

In a preferred embodiment of the present invention, in step d, the array of air holes 6 passing through the cross-section of the glass cover 5 is manufactured by a mechanical method or a chemical method.

In the present invention, the silicon is etched by a dry or wet etching technique to obtain the silicon substrate 1 including the array of micro-pillars 2 or the array of micro-holes 3, the inlet end 13, and the outlet end 14, wherein when the dry etching technique (such as deep reactive-ion etching) is used, an array of vertical micro-holes 3 or an array of vertical micro-pillars 2 can be obtained, as shown in FIGS. 1 and 2.

In a preferred embodiment of the present invention, the plating method in step c includes a chemical plating method and an electroplating method. When a plated electrothermal metal film is made by the electroplating method, highly doped silicon is preferred, such as a p+ type (100) oriented silicon wafer (1-10 Ωcm). After the etching is completed, the photoresist on the etched wafer is removed by cleaning with acetone or nitric acid, and then the residual polymer film deposited during the deep reactive-ion etching is removed by ashing in a high-temperature oxygen atmosphere. Then, the wafer is immersed in 50% hydrofluoric acid to remove the oxide film formed during the ashing process and to strip the residual carbon on the oxidized surface. Before plating with nickel, the wafer is immersed in 1% hydrofluoric acid, then rinsed with deionized water and spin-dried to obtain a clean electroplated surface.

In a preferred embodiment of the present invention, the metal commonly used in the chemical plating method is nickel, and the chemical plating of nickel is a chemical reduction process, including a catalytic reduction of nickel ions in an aqueous solution (containing a reducing agent) and a subsequent deposition of metallic nickel. The process does not require electrical energy consumption. The chemical plating is performed by immersing the obtained silicon substrate 1 in a nickel plating bath containing nickel ions and the reducing agent. To maintain a stable reaction, a nickel ion organic complexing agent, a buffering agent, a stabilizer and the like may be added to the plating bath. Specifically, the nickel plating bath contains: (1) a source of nickel cations, such as nickel chloride and nickel sulfate; (2) a reducing agent, such as a hypophosphite anion, borohydride, or hydrazine; (3) an organic complexing agent that prevents the precipitation of nickel phosphate from complexing nickel ions and simultaneously acts as a buffer to prevent rapid decrease in pH, such as organic hydroxycarboxylic acids including glycolic acid, hydroxypropionic acid, citric acid, malic acid, etc.; (4) an "active agent" that increases the deposition rate of nickel, such as succinate anions, fatty acid anions, and alkali metal fluorides; (5) a stabilizer that prevents solution decomposition, such as thiourea, sodium ethylxanthate, lead sulfide, and tin sulfide; (6) a pH regulator that maintains a constant pH, such as acidic regulator sulfuric acid, and alkaline regulators including sodium hydroxide and sodium carbonate; and (7) a wetting agent that increases the wettability of the plating liquid, such as sulfated alcohols, fatty acid sulfonates, and sulfonated oils. The plating bath may be an alkaline plating bath (pH 8-10) or an acidic plating bath (pH 4-6). The plating bath may include, but is not limited to, the following types: (1) a nickel sulfamate $Ni(NH_2SO_3)_2$ bath; (2) a Watt bath containing nickel sulfate; (3) a nickel fluoborate bath; and (4) a nickel chloride bath.

In a preferred embodiment of the present invention, the types of chemically plated films mainly include an alloy plated film and a metal plated film. The alloy plated film is formed by depositing a nickel alloy on the silicon substrate, where the alloy used is one selected from the group consisting of binary alloys (e.g., Ni—P, Ni—B, etc.), ternary alloys (e.g., Ni—P—B, Ni—W—P, Ni—Co—P, etc.), and quaternary alloys (e.g., Ni—W—Cu—P). The metal plated film refers to a film having pure nickel as the plated layer. p-type silicon or n-type silicon may be selected depending on the type of alloy to be plated.

In a preferred embodiment of the present invention, the electroplating method includes the following two types.

Method 1: the intrinsic oxides in the micro-holes 3 and micro-pillars 2 are removed with hydrofluoric acid and then the silicon substrate is immersed in methanol or ethanol to wet the surface. The silicon substrate 1 is placed in a nickel plating bath. In the nickel plating bath, a Pt-plated Ti electrode is used as an anode, and the cathode is the silicon substrate with the array of micro-holes 3 and the array of micro-pillars 2 for electroplating. During electroplating, the plating liquid is stirred and the plating bath is maintained at a predetermined temperature (45-65° C.) to obtain a uniform nickel ion distribution. By selecting the plating conditions, nickel or nickel alloy can be deposited along the inner walls of the micro-holes 3 or the outer walls of the micro-pillars 2 without being deposited on the top and bottom horizontal surfaces outside the micro-pillars 2. The surface thickness of the deposited metal film can be further adjusted by changing the plating time.

Method 2: plasma-enhanced chemical vapor deposition (PEVCD) is used to deposit a certain thickness of silicon oxide on the top of the silicon substrate with the array of micro-holes 3. The silicon substrate is immersed in methanol or ethanol to wet the surface and then placed in a nickel plating bath. The electroplating is performed by the nickel plating manner of method 1. Due to the thin oxide mask layer, no deposition occurs on the top horizontal surface of the silicon substrate. This method can cover all the inner wall surfaces of the micro-holes 3 with nickel and its alloy. The thickness of the plated film can be adjusted by changing the plating time and current.

The silicon substrate is preferably a highly doped p+ type or n+ type silicon wafer, because conventional p-type or n-type silicon wafer has high resistivity and is difficult to electroplate. If a conventional p-type or n-type silicon wafer is selected, it is required to take additional high temperature doping measures to reduce silicon resistance. As shown in FIG. 8 and FIG. 9, the conventional p-type or n-type silicon wafer is required to be doped with the phosphorus/boron doped layer 7 to reduce the resistance of the silicon substrate 1 and increase the adhesion with the plated layer. The use of the highly doped silicon wafer can fully conduct electricity, reduce silicon resistance, and provide a conductive path between the electrode and the micro-channel during electroplating without the need to deposit a seed layer, namely, a doped layer.

A pure nickel plating has the same type plating bath as the chemical plating. For the electroplating method, a nickel or nickel alloy electrothermal film may be deposited on the inner walls of the micro-holes 3, or the nickel or nickel alloy electrothermal film may be deposited on the outer walls of the micro-pillars 2.

The electroplating may use industrial plating methods such as direct current plating or pulse plating.

The plated layer may be pure nickel or a nickel alloy. Nickel alloys for electroplating may use but not limit to nickel-cobalt alloys, nickel-copper alloys, nickel-cobalt-iron alloys, nickel-copper-iron alloys, etc. The deposition method is irregular deposition. Among them, the nickel-cobalt co-deposition may use a sulfate plating bath, a chloride plating bath, a chloride-sulfate plating bath, or a sulfamate plating bath, the nickel-copper co-deposition uses a citrate plating bath and a pyrophosphate plating bath, and the nickel-cobalt-iron irregular electrodeposition uses a sulfate plating bath, and the nickel-copper-iron irregular electrodeposition uses an acetate plating bath.

The plated metal of the present invention is not limited to nickel or nickel alloys. In theory, any metal with a standard electrode potential that is more positive than the standard electrode potential of $Si/SiO_2$ can be deposited on silicon.

The plated silicon wafer 101 plated with nickel or a nickel alloy is shown in FIG. 3.

In a preferred embodiment of the present invention, the glass cover 5 is preferably made of Pyrex glass with excellent heat resistance. The through-holes 6 are formed on the glass surface by mechanical (such as a micro-drilling technique), chemical (such as hydrofluoric acid corrosion), and other methods with a pore size ranging from nanometers to micrometers.

In a preferred embodiment of the present invention, an anodic bonding process is used for the silicon substrate 1 and the glass cover 5, where the plated silicon wafer 101 and the glass cover 5 are bonded by an anodic bonding method under high temperature and high voltage. The high temperature during bonding improves the adhesion between the electroplated nickel layer and the doped silicon. After the bonding is completed, the bonded silicon wafer 102 is obtained, as shown in FIGS. 4 and 6. The bonded silicon wafers plated with nickel or a nickel alloy on the outer walls of the array of micro-pillars 2 is shown in FIG. 4, and this structure includes the silicon substrate 1, the glass cover 5, the array of micro-pillars 2, and the nickel or nickel alloy plated film 4. The silicon wafer plated with the nickel or nickel alloy on the inner walls of the array of micro-holes 3 is shown in FIG. 6, FIG. 7, and FIG. 8, and this structure includes the silicon substrate 1, the glass cover 5, the doped layer 7, the array of micro-holes 3, and the nickel or nickel alloy plated film 4. The silicon wafer plated with the nickel or nickel alloy on the inner surfaces of the array of the micro-holes 3 is shown in FIG. 9, and this structure includes the silicon substrate 1, the silicon dioxide layer 8, the glass cover 5, the doped layer 7, the array of micro-holes 3, and the nickel or nickel alloy plated film 4. The doped layer 7 is a phosphorus/boron doped layer.

In the present invention, the electronic cigarette liquid inlet end 13 of the bonded silicon wafer 102 is embedded with the electronic cigarette liquid inlet pipe 9, and the outlet end 14 is embedded with the electronic cigarette liquid outlet pipe 10, and the electronic cigarette liquid inlet and outlet are sealed. Among them, the inlet pipe 9 is connected to an electronic cigarette liquid driving device such as a micro pump or a micro driver, and the outlet pipe 10 is connected to a liquid storage tank, so that a circuit is formed between the electronic cigarette liquid driving device, the chip and the liquid storage tank. The diameter of the pipeline is determined by the thickness of the chip and the fluidity of the electronic cigarette liquid. The material of the pipeline is selected from elastic or hard insulating materials such as quartz and polymer with high temperature and corrosion resistance. The electronic cigarette liquid inlet end 13 and the outlet end 14 of the chip are embedded with a liquid-guiding material that can absorb the liquid, such as cotton, fiber, etc., and the other end extends into the liquid in the liquid storage tank to form a circuit between the chip and the liquid storage tank. The electronic cigarette liquid is rapidly dispersed in the micro-channel in the chip by external driving pressure, the capillary effect of the liquid-guiding member, and the surface tension between the electronic cigarette liquid and the micro-channel. Embedding wires 11 is inserting the wires into the chip, so that the metal micro-channel is electrically connected to an external power source. The wires and the chip can be fixed by welding or sintering. High temperature conductive liquid glue may be used as an electrical connection point. Finally, the plated silicon-based atomizing chip 103 is prepared, as shown in FIGS. 10 and 11.

In the present invention, silicon is a substrate material commonly used in micro-electromechanical systems (MEMS). Various patterns and structures can be prepared on the surface and inside of the silicon material through a micro-machining technique. Since metals and alloys can be deposited on recessed and non-uniform surfaces in the electrodeposition process, the present invention can be applied to the MEMS field. Silicon as a substrate for metal deposition has the following features: silicon commonly has a weak interaction with deposited metals, which leads to the three-dimensional island-like growth of the metals in silicon. Once metal deposition occurs on the silicon surface, there may be electrochemical reactions on the deposited surface with a reaction rate faster than the unplated silicon surface. As a semiconductor, silicon transfers electrons to the valence band through conduction band or hole injection to induce a cathodic reaction or deposition reaction. In addition, silicon has a feature of photo-induced excitation. Porous semiconductors are not insulated, which makes it possible for electrodeposition of metals in the hole walls of silicon. Moreover, silicon is cheap and its surface can act as a reducing agent, which can spontaneously deposit some metals. The use of nickel and its alloys is based on the following reasons: first, the physical and chemical properties and electrical and thermal properties of pure nickel and nickel-based alloys meet the requirements of electronic cigarettes in working parameters such as voltage, power, and atomization temperature; second, nickel and its alloys are inexpensive and meet the cost requirements of electronic cigarette products; and third, nickel and its alloys are commonly used metals for plating in the electroplating industry and the metal deposition process is simple, mature and reliable.

The preparation and working principle of the device of the present invention are as follows.

First, the array of micro-pillars 2 or the array of micro-holes 3 are etched on the silicon substrate 1 by a micro-machining technique, and the array of micro-pillars 2 or the array of micro-holes 3 defines the electronic cigarette liquid micro-channel. Then, a nickel electrothermal film or a nickel alloy electrothermal film is plated on the surface of the micro-channel by electroplating or chemical plating, and the glass cover 5 is bonded on the silicon surface through a bonding process. The electronic cigarette liquid is introduced into the micro-channel inside the chip by the liquid-guiding member (such as liquid-guiding cotton or liquid-guiding pipe) connected to the atomizing chip and atomized by heating while being dispersed. The generated aerosol is released from the air holes 6 of the porous glass.

In the present invention, during the plating process, especially when the plating is performed on the inner wall of the micro-hole 3, the plating may be performed in the direction perpendicular to the inner wall of the micro-hole 3. In this way, the plating is only performed on the inner wall of the micro-hole 3, and the bottom of the micro-hole 3 is not plated. Alternatively, the plating may be performed in the direction perpendicular to the inner wall of the micro-hole 3 and the direction perpendicular to the bottom of the micro-hole 3 simultaneously. When the plating is performed perpendicular to the bottom of the micro-hole 3, the non-porous region of the array of micro-holes 3 is required to be covered with the silicon dioxide layer 8 to prevent the non-porous region from plating, as shown in FIG. 9.

Advantages:

1. The present invention provides an electronic cigarette atomizing chip, where micro-holes or micro-pillars are etched on the silicon substrate, and the micro-holes or micro-pillars define a plurality of micro-channels or electronic cigarette liquid channels on the silicon substrate. These micro-channels or electronic cigarette liquid channels form an electronic cigarette liquid dispersing member, so that the electronic cigarette liquid is dispersed in the micro-channels or micro-holes. The electronic cigarette liquid is uniformly dispersed, the heat is uniform, which makes the electronic cigarette liquid atomize adequately.

2. In the present invention, the surface of the silicon-based heating material is plated so that the electronic cigarette liquid is not affected by the sharp fluctuation of the silicon-based resistance during the heating process. The electronic cigarette liquid can be atomized stably, and the puff number and sensory quality are kept consistent.

3. In the present invention, silicon is used as the substrate material of the atomizing chip, and the cost is low, which greatly reduces the manufacturing cost of the electronic cigarette atomizing chip and is convenient for mass production of this type of atomizing chip.

Figure 1:
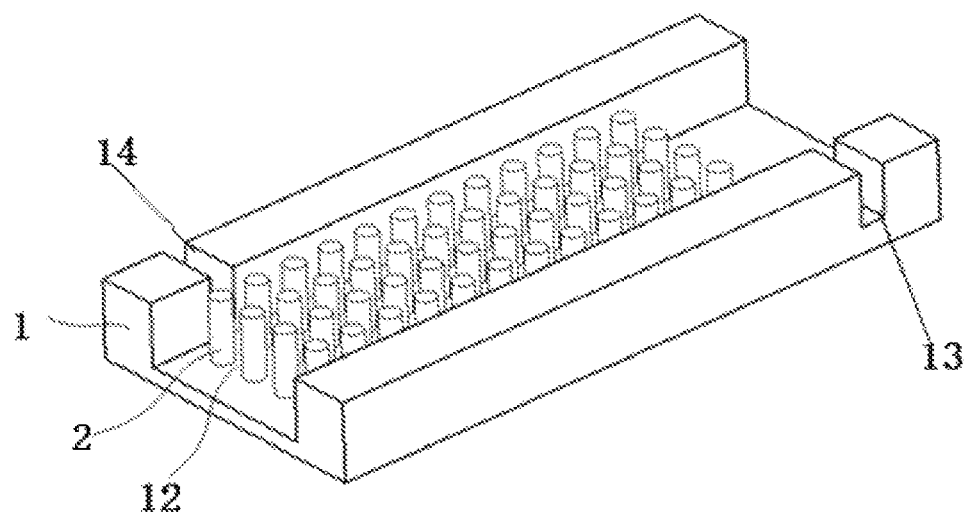
FIG. 1 is a structural schematic diagram of a silicon substrate with micro-channels defined by an array of micro-pillars.
Figure 2:
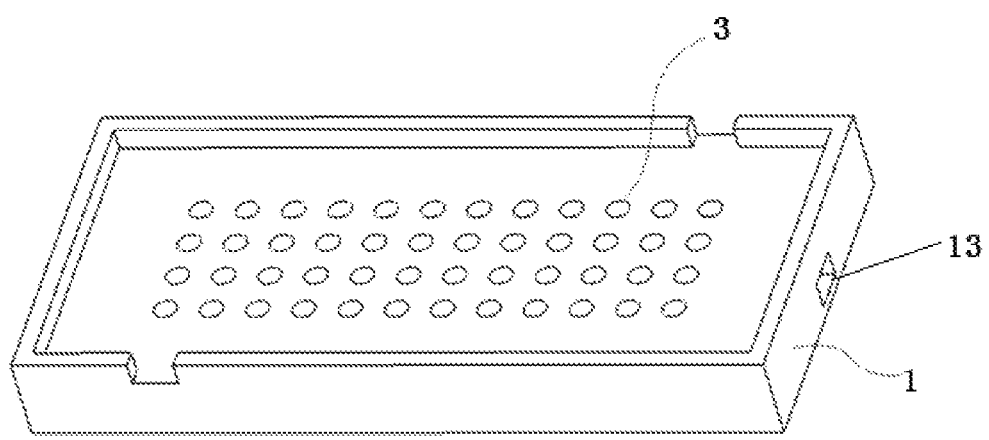
FIG. 2 is a structural schematic diagram of a silicon substrate with micro-channels defined by an array of micro-holes.
Figure 3:
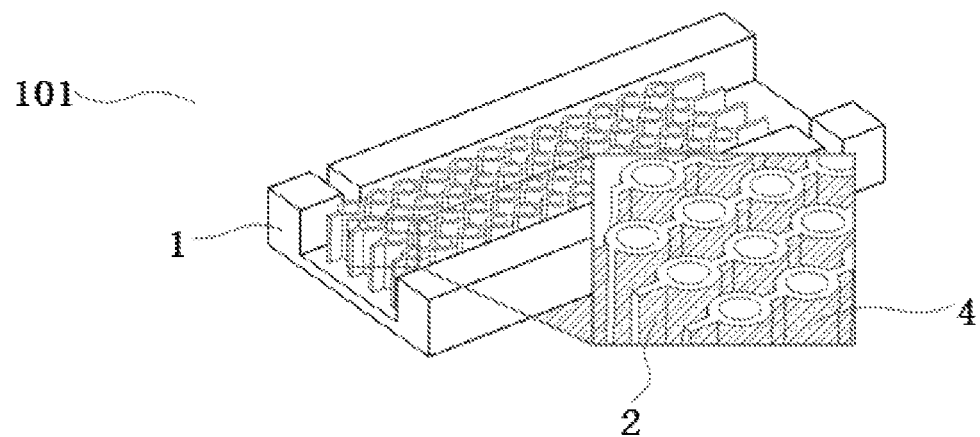
FIG. 3 is a schematic diagram of a silicon substrate with outer walls of an array of micro-pillars plated with nickel or a nickel alloy.
Figure 4:
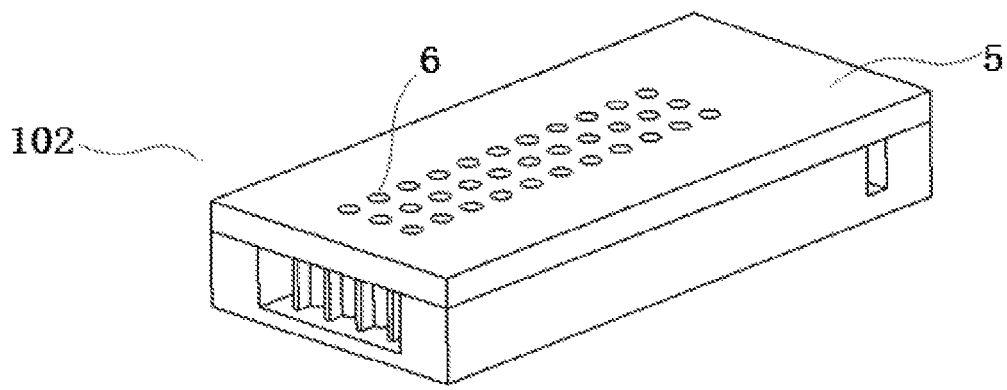
FIG. 4 is a schematic diagram of a bonded silicon wafer with outer walls of an array of micro-pillars plated with nickel or a nickel alloy.
Figure 5:
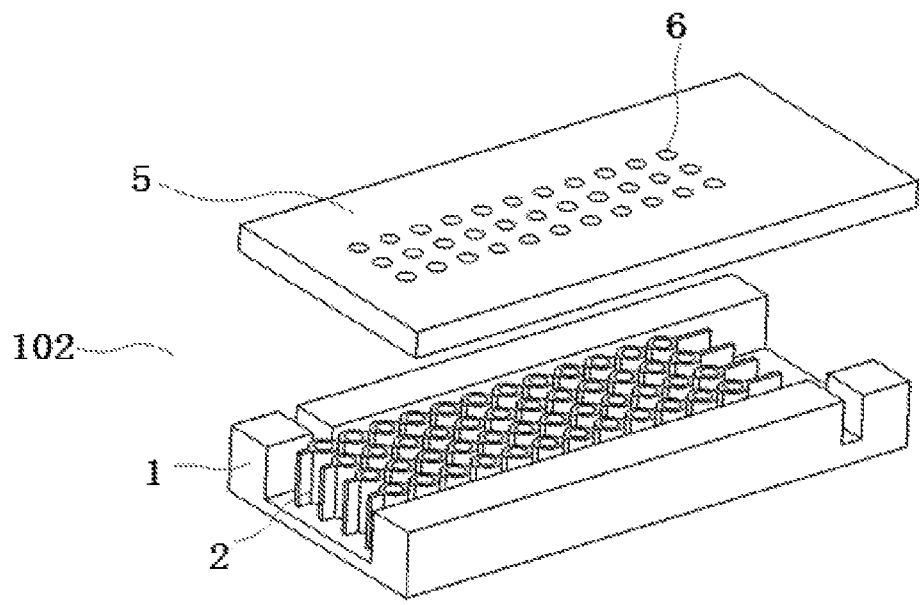
FIG. 5 is an exploded view of a bonded silicon wafer with outer walls of an array of micro-pillars plated with nickel or a nickel alloy.
Figure 6:
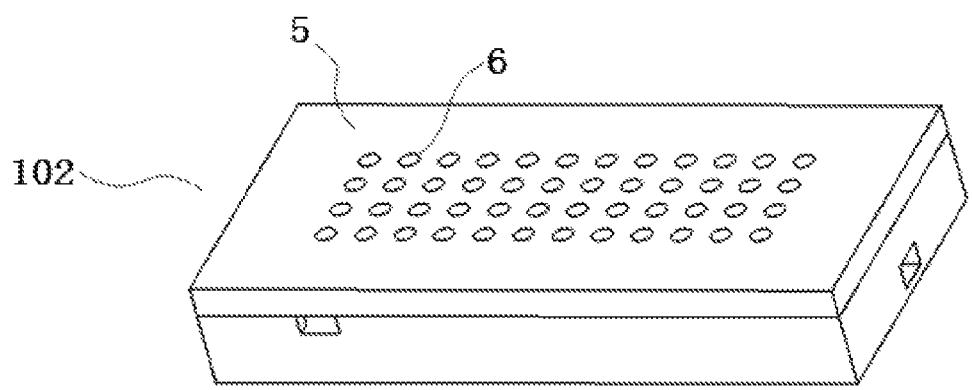
FIG. 6 is a schematic diagram of a bonded silicon wafer with inner walls of an array of micro-holes plated with nickel or a nickel alloy.
Figure 7:
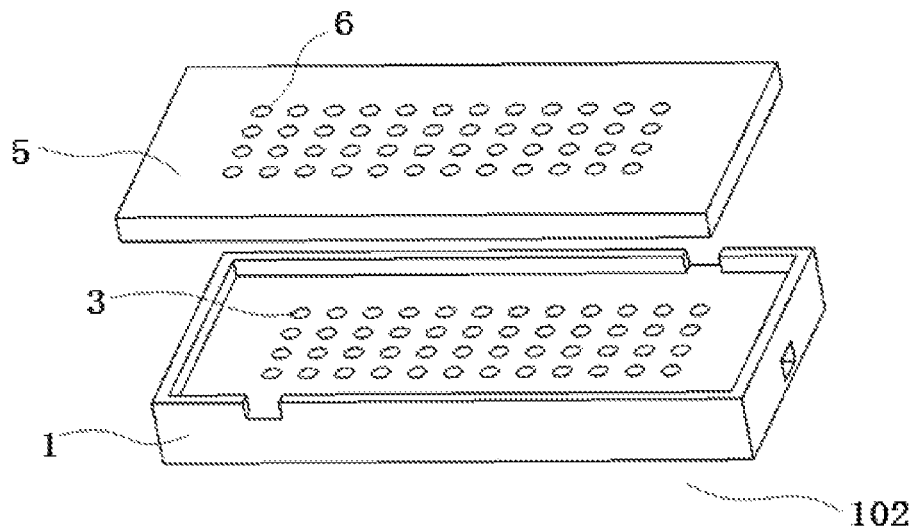
FIG. 7 is an exploded view of a bonded silicon wafer with inner walls of an array of micro-holes plated with nickel or a nickel alloy.
Figure 8:
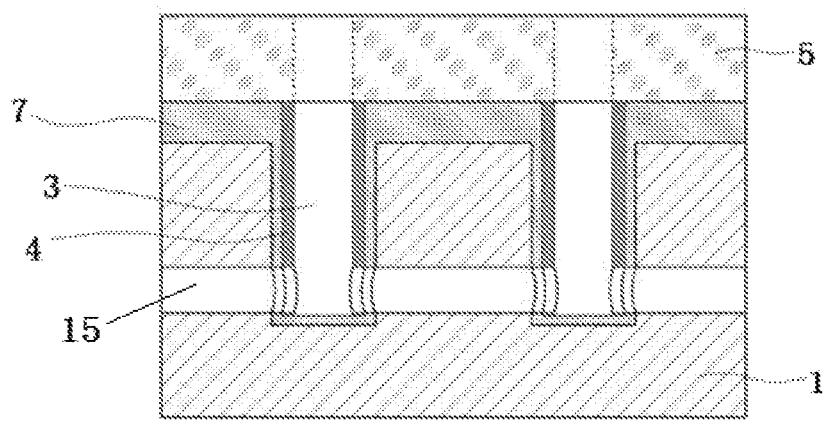
FIG. 8 is a cross-sectional view of a silicon wafer with inner walls of an array of micro-holes plated with nickel or a nickel alloy.
Figure 9:
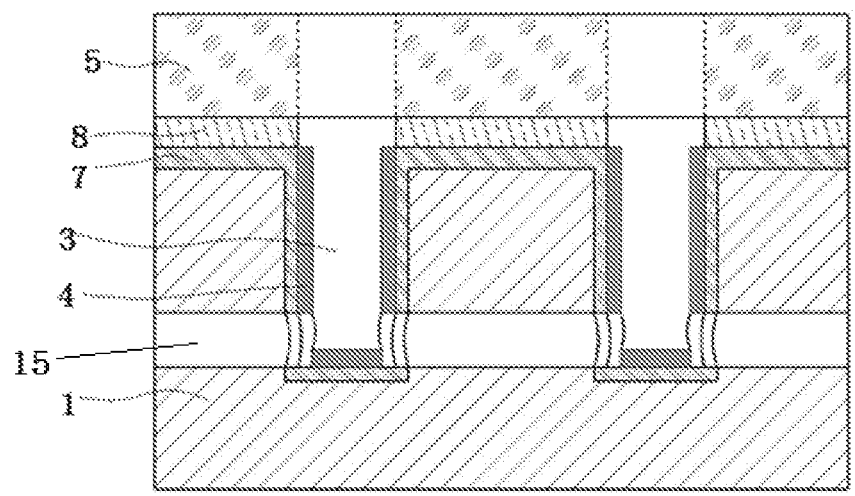
FIG. 9 is another cross-sectional view of a silicon wafer with inner walls of an array of micro-holes plated with nickel or a nickel alloy.
Figure 10:
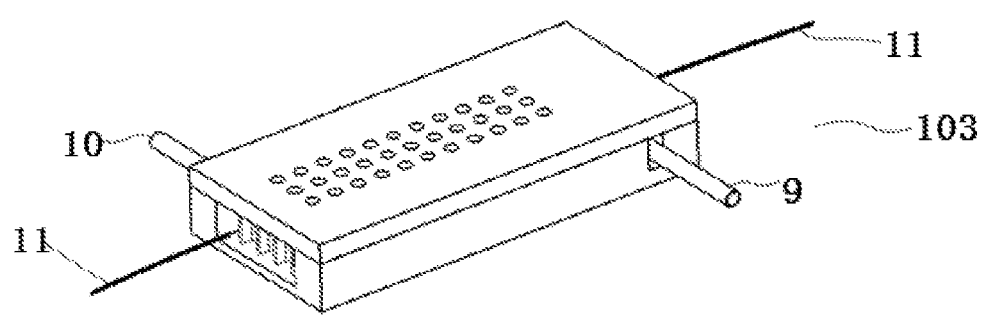
FIG. 10 is a structural schematic diagram of a plated atomizing chip with an array of plated micro-pillars.
Figure 11:
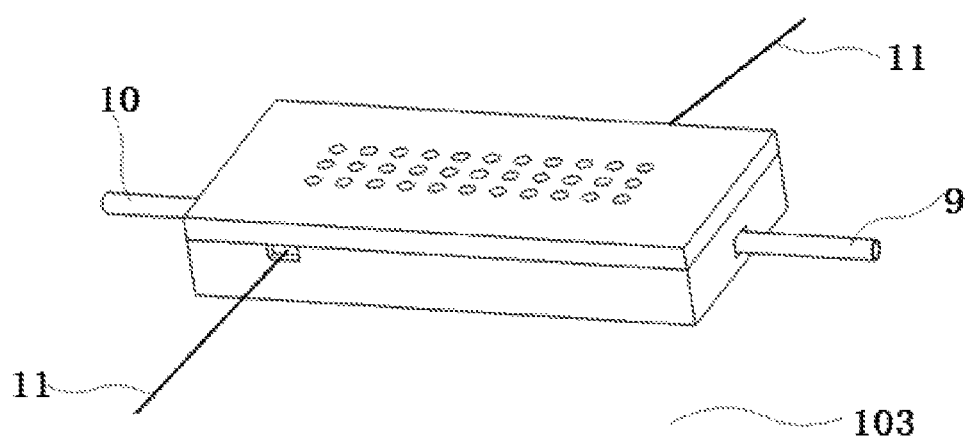
FIG. 11 is a structural schematic diagram of a plated atomizing chip with an array of plated micro-holes.

The meanings of the reference signs are as follows:

1—silicon substrate, 2—micro-pillar, 3—micro-hole, 4—plated film, 5—glass cover, 6—air hole, 7—doped layer, 8—silicon dioxide layer, 9—inlet pipe, 10—outlet pipe, 11—wire, 12—micro-channel, 13—inlet end, 14—outlet end, 15—electronic cigarette liquid channel, 101—plated silicon wafer, 102—bonded silicon wafer, and 103—plated silicon-based atomizing chip.

DETAILED DESCRIPTION OF THE EMBODIMENTS

Embodiment 1

The structure of the plated silicon-based electronic cigarette atomizing chip in this embodiment is as follows.

The array of micro-pillars 2, the inlet end 13, and the outlet end 14 are arranged on the silicon substrate 1. The outer walls of the micro-pillars 2 are plated side walls. The array of micro-pillars 2 defines a plurality of micro-channels 12.

The glass cover 5 is provided with the air holes 6 that pass through the glass cover 5.

The glass cover 5 and the silicon substrate 1 are fixedly connected by an anodic bonding process.

In this embodiment, an electroplating method is used to plate the outer walls of the micro-pillars 2, and nickel is used as the plated metal.

Embodiment 2

The structure of the plated silicon-based electronic cigarette atomizing chip in this embodiment is as follows.

The array of micro-holes 3, the inlet end 13, and the outlet end 14 are arranged on the silicon substrate 1. The inner walls of the micro-holes 3 are plated inner walls. The electronic cigarette liquid channels that passes through the micro-holes 3 are provided on the silicon substrate 1.

The glass cover 5 is provided with the air holes 6 that pass through the glass cover 5.

The glass cover 5 and the silicon substrate 1 are fixedly connected by an anodic bonding process.

In this embodiment, a chemical plating method is used to plate the inner walls of the micro-holes 3, and a Ni—P alloy is used as the plated metal.

What is claimed is:

1. A plated silicon-based electronic cigarette atomizing chip, comprising the following components:
    a silicon substrate, wherein the silicon substrate is provided with an array of micro-pillars or an array of micro-holes, an inlet end, and an outlet end, outer walls of the array of micro-pillars are plated side walls, inner walls of the array of micro-holes are plated inner walls, and the array of micro-pillars defines a plurality of micro-channels or electronic cigarette liquid channels penetrating the array of micro-holes are provided on the silicon substrate;
    a glass cover, wherein air holes passing through the glass cover are provided; and
    the glass cover is fixedly connected to the silicon substrate by a bonding process.

2. The plated silicon-based electronic cigarette atomizing chip according to claim 1, wherein a plated metal on the plated outer walls of the array of micro-pillars or the plated inner walls of the array of micro-holes is a metal or an alloy, wherein a standard electrode potential of metal or an alloy is more positive than a standard electrode potential of $Si/SiO_2$.

3. The plated silicon-based electronic cigarette atomizing chip according to claim 1, wherein a diameter of each of the micro-pillars or each of the micro-holes ranges from 20 μm to 300 μm.

4. A method for preparing a plated silicon-based electronic cigarette atomizing chip, comprising the following steps:
    a, etching an array of micro-pillars or an array of micro-holes, an inlet end, and an outlet end on a silicon substrate;
    b, cleaning the silicon substrate after being etched in step a to obtain a clean electroplated surface of the silicon substrate;
    c, plating outer walls of an array of micro-pillars or inner walls of an array of micro-holes by a plating method to obtain a plated silicon wafer;
    d, manufacturing an array of air holes passing through a glass cover;
    e, bonding the plated silicon wafer obtained in step c with the glass cover obtained in step d to obtain a bonded silicon wafer by a bonding process; and
    f, filling an inlet pipe or a liquid-guiding material at the inlet end of the bonded silicon wafer, filling an outlet pipe or the liquid-guiding material at the outlet end, then, inserting wires into the bonded silicon wafer to obtain the plated silicon-based electronic cigarette atomizing chip.

5. The method for preparing the plated silicon-based electronic cigarette atomizing chip according to claim 4, wherein
    the cleaning in step b comprises: 1), cleaning and removing a photoresist etched on the silicon substrate with acetone or nitric acid; 2), ashing in an oxygen atmosphere to remove an residual polymer film, 3) immersing the silicon substrate in hydrofluoric acid to remove an oxide film formed during the ashing and to strip residual carbon from an oxidized surface; and 4) immersing the silicon substrate in hydrofluoric acid, then washing the silicon substrate with water and drying the silicon substrate to obtain the clean electroplated surface.

6. The method for preparing the plated silicon-based electronic cigarette atomizing chip according to claim 4, wherein the plating method in step c comprises a chemical plating method or an electroplating method.

7. The method for preparing the plated silicon-based electronic cigarette atomizing chip according to claim 4, wherein in step d, a mechanical method or a chemical method is configured to prepare the array of air holes passing through a cross-section of the glass cover.

* * * * *